(12) United States Patent
Sung (10) Patent No.: US 10,249,770 B2
(45) Date of Patent: Apr. 2, 2019

(54) SOLAR CELL MODULE (71) Applicant: LG INNOTEK CO., LTD., Seoul (KR)

(72) Inventor: Myoung Seok Sung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 201 days.

(21) Appl. No.: 15/030,182

(22) PCT Filed: Oct. 10, 2014

(86) PCT No.: PCT/KR2014/009545
§ 371 (c)(1),
(2) Date: Apr. 18, 2016

(87) PCT Pub. No.: WO2015/056934
PCT Pub. Date: Apr. 23, 2015

(65) Prior Publication Data
US 2016/0240697 A1    Aug. 18, 2016

(30) Foreign Application Priority Data

Oct. 18, 2013 (KR) .................. 10-2013-0124873

(51) Int. Cl.
H01L 31/046 (2014.01)
H01L 31/0224 (2006.01)
H01L 31/02 (2006.01)

(52) U.S. Cl.
CPC .. *H01L 31/0201* (2013.01); *H01L 31/022441* (2013.01); *H01L 31/046* (2014.12); *Y02E 10/50* (2013.01)

(58) Field of Classification Search
None
See application file for complete search history.

(56) References Cited

U.S. PATENT DOCUMENTS 6,168,968 B1 * 1/2001 Umemoto .......... B23K 26/0732
                                                          136/244
6,441,301 B1 * 8/2002 Satoh .................. H01L 31/0322
                                                          136/244
(Continued)

FOREIGN PATENT DOCUMENTS

CN    102138225 A    7/2011
CN    102412315 A    4/2012
(Continued)

OTHER PUBLICATIONS

Office Action dated Nov. 30, 2016 in Chinese Application No. 201480057378.3.
(Continued)

*Primary Examiner* — Magali P Slawski
(74) *Attorney, Agent, or Firm* — Saliwanchik, Lloyd and Eisenschenk (57) ABSTRACT The solar cell module according to the present invention includes: a supporting substrate; a back electrode layer arranged on the supporting substrate; a light absorbing layer arranged on the back electrode layer; a front electrode layer arranged on the light absorbing layer; and a bus bar arranged to be in contact with the top and side surfaces of the back electrode layer. In the solar cell according to an embodiment, the bus bar is arranged to be in contact with the top and side surfaces of the back electrode layer, which enables charge transfer both in the direction of the top surface and in the direction of the side surface, thereby facilitating the transfer of charge moving on the back electrode layer in the direction of the bus bar. Accordingly, the solar cell module according to an embodiment can increase the amount of charge transfer from the back electrode layer to the bus bar, thereby improving the efficiency of the solar cell module overall.

17 Claims, 4 Drawing Sheets (56) References Cited

U.S. PATENT DOCUMENTS

| | | |
|---|---|---|
| 2007/0163646 A1* | 7/2007 | Kushiya .......... H01L 31/022425 |
| | | 136/264 |
| 2011/0088750 A1 | 4/2011 | Stolt et al. |
| 2011/0259395 A1 | 10/2011 | Wieting et al. |
| 2011/0284070 A1 | 11/2011 | Suzuki |
| 2012/0103416 A1* | 5/2012 | Kwon ............. H01L 31/022425 |
| | | 136/256 |
| 2012/0186624 A1 | 7/2012 | Lee |
| 2013/0125980 A1 | 5/2013 | Cho |
| 2013/0180567 A1 | 7/2013 | Takeda et al. |
| 2013/0306146 A1 | 11/2013 | Sung et al. |
| 2013/0312826 A1* | 11/2013 | Narita ............. H01L 31/022425 |
| | | 136/256 |
| 2015/0096606 A1* | 4/2015 | Karst .................. H01L 31/0322 |
| | | 136/244 |

FOREIGN PATENT DOCUMENTS

| | | |
|---|---|---|
| CN | 103140938 A | 6/2013 |
| JP | 2010272582 A | 12/2010 |
| KR | 20120085567 A | 8/2012 |
| WO | WO-2011055946 A2 | 5/2011 |

OTHER PUBLICATIONS

International Search Report in International Application No. PCT/KR2014/009545, filed Oct. 10, 2014.

* cited by examiner

SOLAR CELL MODULE

CROSS-REFERENCE TO RELATED APPLICATION

This application is the U.S. national stage application of International Patent Application No. PCT/KR2014/009545, filed Oct. 10, 2014, which claims priority to Korean Application No. 10-2013-0124873, filed Oct. 18, 2013, the disclosures of each of which are incorporated herein by reference in their entirety.

TECHNICAL FIELD

The embodiment relates to a solar cell module.

BACKGROUND ART

Recently, as the depletion of an energy resource such as petroleum or coal is expected, the interest in the substitute energy has been more increased. In this regard, a solar cell converting solar energy into electrical energy has been spotlighted.

A solar cell (or photovoltaic cell) is a core element in solar power generation to directly convert solar light into electricity.

For example, if the solar light having energy greater than band-gap energy of a semiconductor is incident into a solar cell having the PN junction structure of a semiconductor, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

The current generated from the solar cell is transferred to a junction box through a bus bar. In general, the bus bar is formed on the front surface of a solar cell panel and extends to a rear surface of the solar cell panel through a hole formed in the solar cell panel to allow the current to flow into the junction box.

In this case, the bus bar may be provided on a top surface of the back electrode layer in the solar cell. In this case, the surface of the back electrode layer may have mutually different compositions according to the parts of the solar cell. The degree of charge collection may be variable depending on positions of bus bars due to the state variation on the surface of the back electrode layer.

Accordingly, there is required a solar cell having a novel structure capable of improving charge collection when the bus bar is formed on the solar cell panel.

DISCLOSURE

Technical Problem

The embodiment provides a solar cell module having improved photoelectric conversion efficiency.

Technical Solution

According to the embodiment, a solar cell module includes a support substrate, a back electrode layer on the support substrate, a light absorbing layer on the back electrode layer, a front electrode layer on the light absorbing layer, and a bus bar in contact with a top surface and a lateral side of the back electrode layer.

Advantageous Effects

As described above, according to the solar cell of the embodiment, the groove or the hole is formed in the back electrode layer having the bus bar, so that the bus bar may make contact with not only the top surface of the back electrode layer, but also the lateral side of the back electrode layer.

The top surface of the back electrode layer is a contact part between the back electrode layer and the light absorbing layer and includes $MoSe_2$ reacting with Se, as well as Mo. The $MoSe_2$ serves as a resistance layer in the process of transferring the back electrode layer to the bus bar, thereby preventing charges from being moved.

Accordingly, when the bus bar is positioned only on the top surface of the back electrode layer, as the charge movement is prevented by $MoSe_2$ included in the top surface of the back electrode layer and thus lowered, the efficiency of the solar cell module may be degraded.

Therefore, according to the solar cell of the embodiment, a hole or a groove may be formed in the back electrode layer having the bus bar to expose the lateral side of the back electrode layer. Since the lateral side of the back electrode layer may include Mo more than $MoSe_2$, the prevention of charge movement by $MoSe_2$ may less occur in the lateral side of the back electrode layer.

In other words, according to the solar cell of the embodiment, as the bus bar is arranged in contact with the top surface and the lateral side of the back electrode layer, charge movement may occur toward both of the top surface and the lateral side of the back electrode layer. Accordingly, charges can be more easily moved from the back electrode layer to the bus bar.

Therefore, according to the solar cell module of the embodiment, since an amount of charges moved from the back electrode layer to the bus bar may be improved, the whole efficiency of the solar cell module can be improved.

BEST MODE

Mode for Invention

In the following description of the embodiments, it will be understood that, when a layer (film), a region, a pattern or a structure is referred to as being "on" or "under" a substrate, another layer (film), another region, another pad or other patterns, it can be "directly" or "indirectly" on the other layer (film), region, pattern or structure, or one or more intervening layers may also be present. Such a position of each layer described with reference to accompanying drawings.

The thicknesses or sizes of each layer (film), region, pattern or structures shown in the drawings may be exaggerated for the purpose of explanation and clarity, and may not utterly reflect the actual size.

Hereinafter, the embodiments of the disclosure will be described in detail with reference to accompanying drawings.

Referring to FIGS. 1 to 9, a solar cell module according to the embodiment may include a solar cell panel 100, a protective layer 300, and an upper substrate 400.

Figure 1:
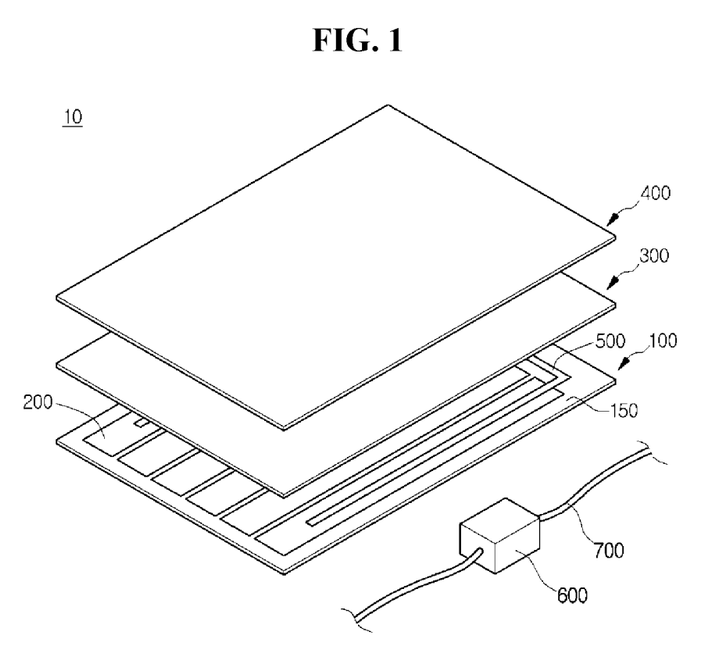
FIG. 1 is an exploded perspective view showing a solar cell module according to the embodiment.

The solar cell panel 100 may have a plate shape. The solar cell panel 100 may include a support substrate 150, a plurality of solar cells 200, and bus bars 500.

The support substrate 150 may have a plate shape. In addition, the support substrate 150 may include an insulator. The support substrate 150 may include a glass substrate, a plastic substrate, or a metallic substrate. In more detail, the support substrate 150 may include a soda lime glass substrate. Alternatively, the support substrate 150 may include a ceramic substrate including alumina, stainless steel, or polymer having flexibility. The support substrate 150 may be transparent. The support substrate 150 may be rigid or flexible.

The solar cells 200 may be provided on the support substrate 150.

For example, the solar cells 200 may include a CIGS-based solar cell, a silicon-based solar cell, a dye-sensitized solar cell, a group III-IV compound semiconductor solar cell, or a group III-V compound semiconductor solar cell.

Figure 3:
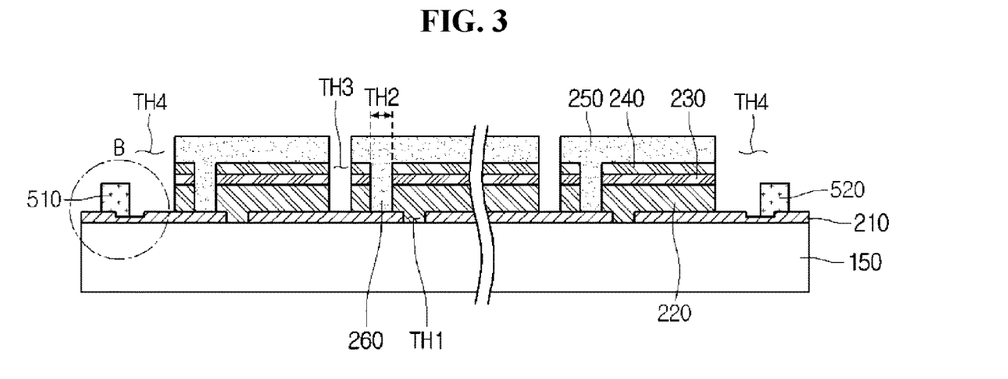
FIG. 3 is a sectional view taken along line A-A' of the solar cell module of FIG. 2.

For example, the solar cells 200 may include a CIGS-based solar cell. In detail, the solar cell 200 may include a back electrode layer 210 on the support substrate 150, a light absorbing layer 220 on the back electrode layer 210, a buffer layer 230 on the light absorbing layer 220, and a front electrode layer 240 on the buffer layer 230.

The back electrode layer 210 is a conductive layer. For example, the back electrode layer 210 may include metal such as molybdenum (Mo).

In addition, the back electrode layer may include at least two layers. For example, the back electrode layer 210 may include a first back electrode layer 211 including Mo and a second back electrode layer 212 including $MoSe_2$.

The back electrode layer 210 is formed therein with first through grooves TH1. The first through grooves TH1 have open areas to expose a top surface of the support substrate 10. When viewed in a plan view, the first through grooves TH1 may have the shape extending in a first direction.

Each of the first through grooves TH1 may have a width in the range of about 80 μm to about 200 μm, but the embodiment is not limited thereto.

The back electrode layer 210 is divided into a plurality of rear electrodes by the first through grooves TH1. In other words, the plurality of rear electrodes may be defined by the first through grooves TH1.

The rear electrodes are spaced apart from each other by the first through grooves TH1. The rear electrodes are arranged in the shape of a stripe.

Alternatively, the rear electrodes may be arranged in the shape of a matrix. In this case, when viewed in a plan view, the first through grooves TH1 may be provided in the shape of a lattice.

The light absorbing layer 220 may be disposed on the back electrode layer 210. In addition, the material constituting the light absorbing layer 220 is filled in the first through grooves TH1.

The light absorbing layer 220 may include group compounds. For instance, the light absorbing layer 220 may include the $Cu(In, Ga)Se_2$ (CIGS) crystal structure, the $Cu(In)Se_2$ crystal structure, or the $Cu(Ga)Se_2$ crystal structure.

The buffer layer 230 is disposed on the light absorbing layer 220. The buffer layer 230 makes direct contact with the light absorbing layer 220.

The buffer layer 230 may include CdS or ZnO.

A high resistance buffer layer 240 may be further disposed on the buffer layer 230. The high resistance buffer layer 240 may include zinc oxide (i-ZnO) which is not doped with impurities.

Second through grooves TH2 may be formed in the buffer layer 400. The second through grooves TH2 may be open regions to expose the top surface of the back electrode layer 210. When viewed in a plan view, the second through grooves TH2 may extend in one direction. The width of the second through grooves TH2 may be in the range of about 80 μm to about 200 μm, but the embodiment is not limited thereto.

The buffer layer 230 may be defined as a plurality of buffer layers by the second through grooves TH2. That is, the buffer layer 230 may be divided into the buffer layers by the second through grooves TH2.

The front electrode layer 250 is provided on the buffer layer 230. The front electrode layer 250 is a transparent conductive layer. In addition, the resistance of the front electrode layer 250 is greater than that of the back electrode layer 210.

The front electrode layer 250 includes oxide. For example, a material constituting the front electrode layer 250 may include aluminum doped zinc oxide (AZO), indium zinc oxide (IZO) or indium tin oxide (ITO).

The front electrode layer 250 includes connecting parts 260 placed in the second through grooves TH2.

Third through grooves TH3 are formed in the light absorbing layer 220, the buffer layer 230, and the front electrode layer 250. The third through grooves TH3 may pass through a part or all of the buffer layer 230, the high resistance buffer layer 240 and the front electrode layer 250. That is, the third through grooves TH3 may expose the top surface of the back electrode layer 210.

The third through grooves TH3 are adjacent to the second through grooves TH2. In detail, the third through grooves TH3 are provided beside the second through grooves TH2. That is, when viewed in a plan view, the third through grooves TH3 are formed beside the second through grooves TH2 in parallel to the second through grooves TH2. The third through grooves TH3 may extend in the first direction.

The front electrode layer 500 may be divided into a plurality of front electrodes by the third through grooves TH3. That is, the front electrodes may be defined by the third through grooves TH3.

The front electrodes may have a shape corresponding to that of the rear electrodes. That is, the front electrodes may be arranged in the shape of a stripe. Alternatively, the front electrodes may be arranged in the form of a matrix.

In addition, a plurality of solar cells C1, C2, . . . are defined by the third through grooves TH3. In detail, the solar cells C1, C2, . . . are defined by the second and third through grooves TH2 and TH3. That is, the solar cell according to an embodiment is divided into the solar cells C1 and C2 by the second and third through grooves TH2 and TH3. In addition, the solar cells C1 and C2 are connected to each other in a second direction crossing the first direction. That is, current may flow through the solar cells C1 and C2 in the second direction.

In other words, the solar cell panel 100 includes the support substrate 150 and the solar cells C1 and C2. The solar cells C1 and C2 are disposed on the support substrate 150 while being spaced apart from each other. In addition, the solar cells C1 and C2 are connected in series to each other through the connecting parts 260.

The connection parts 260 are provided inside the second through grooves TH2. The connection parts 260 extend downward from the front electrode layer 500 and connected with the back electrode layer 200. For example, the connecting parts 260 extend from the front electrode of the first cell C1 and are connected to the rear electrode of the second cell C2.

Accordingly, the connection parts 260 connect mutually adjacent cells to each other. In detail, the connection parts 260 connect the front and back electrodes included in each of the mutually adjacent solar cells.

The connecting part 260 is integrated with the front electrode layer 250. That is, a material constituting the connecting part 260 is identical to a material constituting the front electrode layer 250.

Figure 2:
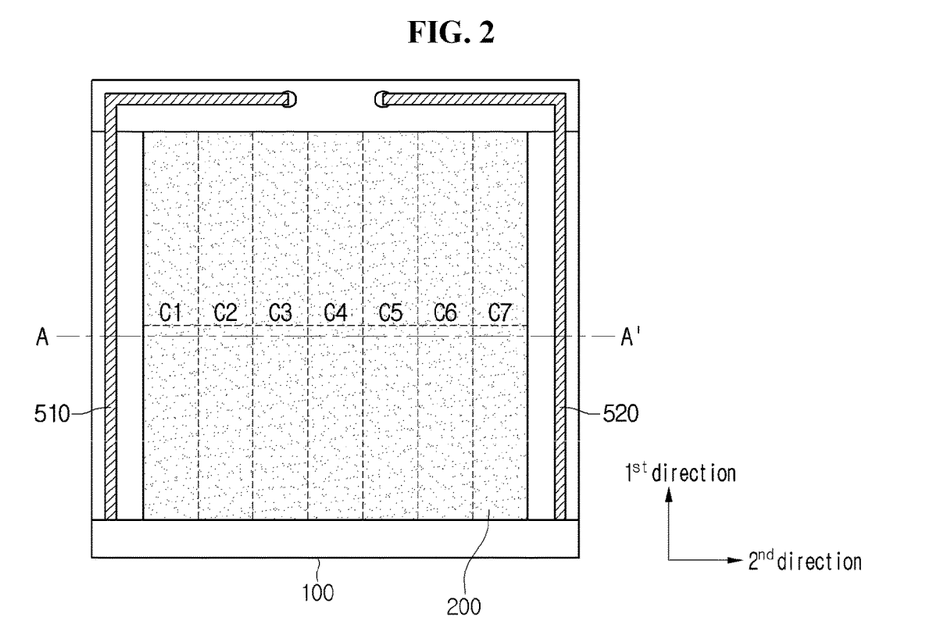
FIG. 2 is a plan view showing the solar cell module according to the embodiment.

Referring to FIG. 2, the solar cells 200 may include a first solar cell C1 and a second solar cell C7 provided at outermost parts of the solar cells 200.

The bus bars 500 may be provided at the first solar cell C1 and the second solar cell C7. In detail, the first solar cell C1 and the second solar cell C7 provided at the outermost parts are etched such that the top surface of the back electrode layer is exposed, and the bus bars 500 may be provided on the back electrode layer of the first solar cell C1 and the second solar cell C7.

In detail, the bus bar 500 may include a first bus bar 510 and a second bus bar 520. In detail, the first bus bar 510 may be provided on the first solar cell C1, and the second bus bar 520 may be provided on the second solar cell C7.

The first bus bar 510 may be connected with the first solar cell C1. In detail, the first bus bar 510 may be directly connected with the first solar cell C1.

In addition, the second bus bar 520 may be connected with the second solar cell C7. In detail, the second bus bar 520 may be directly connected with the second solar cell C7.

The first bus bar 510 and the second bus bar 520 may include a conductive tape or a conductive paste. The first bus bar 510 and the second bus bar 520 may include copper (Cu), silver (Ag), or aluminum (Al).

Referring to FIG. 3, the first solar cell C1 and the second solar cell C7 may be formed therein with fourth through holes TH4. The fourth through holes TH4 may pass through the front electrode layer 250, the buffer layer 230, and the light absorbing layer 220. Accordingly, the top surfaces of the back electrode layers 210 of the first solar cell C1 and the second solar cell C7 may be exposed by the fourth through holes TH4.

The back electrode layers 210 of the first solar cell C1 and the second solar cell C7 exposed by the fourth through holes TH4 may be formed therein with a groove G or a hole H.

Figure 4:
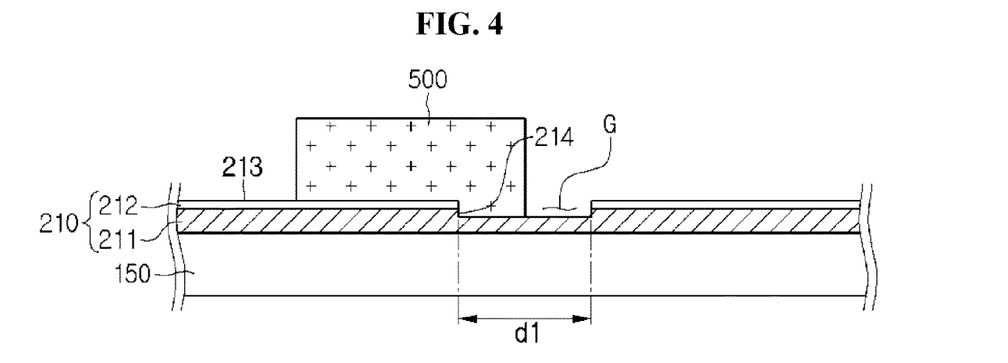
FIG. 4 is an enlarged sectional view showing part B of FIG. 3.
Figure 5:
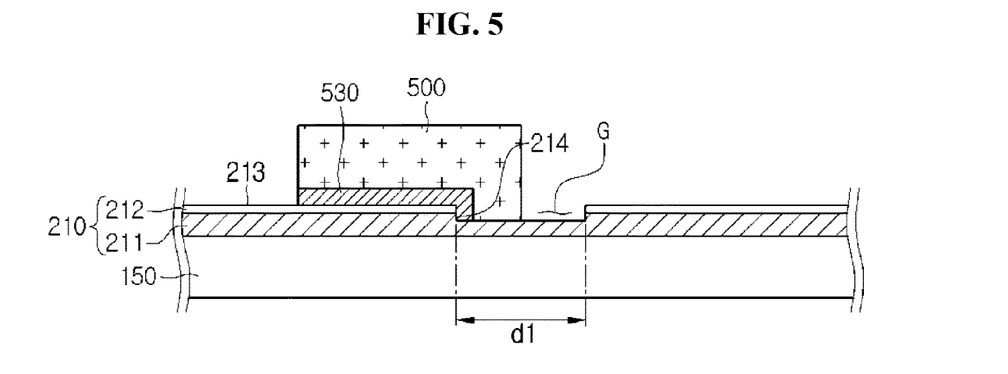
FIG. 5 is another enlarged sectional view showing part B of FIG. 3.

For example, as shown in FIGS. 3 to 5, the back electrode layer 210 exposed by the fourth through holes TH4 may be formed therein with a groove G.

Accordingly, the back electrode layer 210 may include a top surface 213 of the back electrode layer 210 exposed by the fourth through holes TH4 and a lateral side 214 of the back electrode layer 210 exposed by the groove G.

The top surface 213 of the back electrode layer 210 may include $MoSe_2$. The lateral side 214 of the back electrode layer 210 may include Mo. In detail, the lateral side 214 of the back electrode layer 210 may include $MoSe_2$ and Mo.

The top surface 213 of the back electrode layer may be different from the lateral side 214 of the back electrode layer in electrical conductivity or electrical resistance. In detail, the electrical resistance of the lateral side 214 of the back electrode layer may be lower than that of the top surface 213 of the back electrode layer. In detail, the electrical resistance of the top surface 213 of the back electrode layer may be twice to 20 times higher than that of the lateral side 214 of the back electrode layer.

Referring to FIG. 4, the first bus bar 510 and the second bus bar 520 may be provided in grooves G formed in the back electrode layers 210 of the first solar cell C1 and the second solar cell C7. In detail, the first bus bar 510 and the second bus bar 520 may make contact with the top surface 213 of the back electrode layer 210 exposed by the fourth through holes TH4 and the lateral side 214 of the back electrode layer 210 exposed by the groove G.

Accordingly, the first bus bar 510 and the second bus bar 520 may make contact with the top surface 213 of the back electrode layer 210 exposed by the fourth through holes TH4, the lateral side 214 of the back electrode layer 210 exposed by the groove G, and the top surface of the back electrode layer 210 exposed by the groove G.

Alternatively, as shown in FIG. 5, a conductive material 530 may be formed on the lateral side 214 and the top surface 213 of the back electrode layer exposed by the groove G, and the first and second bus bars 510 and 520 may make contact with the conductive material 530.

The first bus bar 510 and the second bus bar 520 may be partially filled in the groove G. For example, the width d1 of the groove G may be in the range of about 6 mm to 12 mm. In addition, the first bus bar 510 and the second bus bar 520 may be filled to about ⅓ to about ⅔ of the width d1 of the groove G while making contact with the lateral side 214 of the back electrode layer.

If the width d1 of the groove G is less than 6 mm, the first bus bar 510 and the second bus bar 520 may be excellently inserted into the groove G. If the width d1 of the groove G exceeds 12 mm, a dead zone where power generation does not occur is increased, so that efficiency may be degraded.

Figure 6:
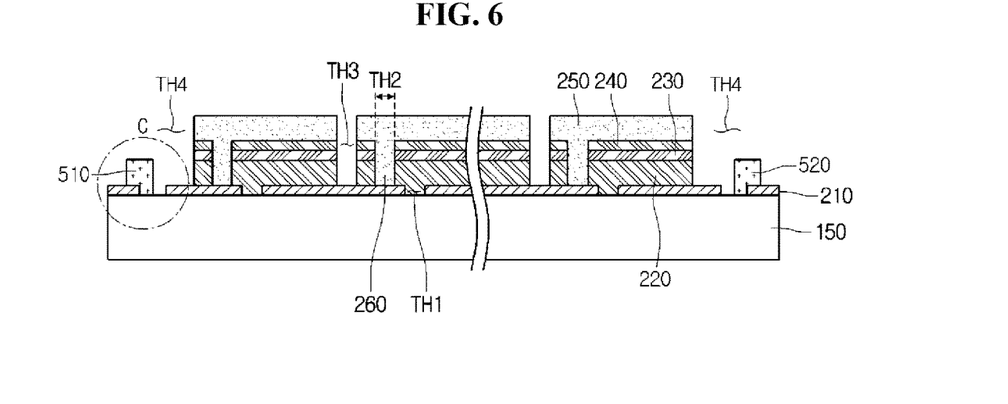
FIG. 6 is another sectional view taken along line A-A' of the solar cell module of FIG. 2.
Figure 7:
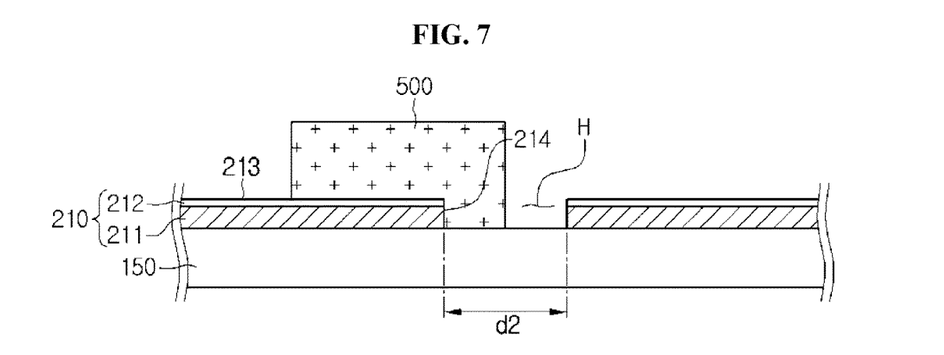
FIG. 7 is an enlarged sectional view showing part C of FIG. 6.
Figure 8:
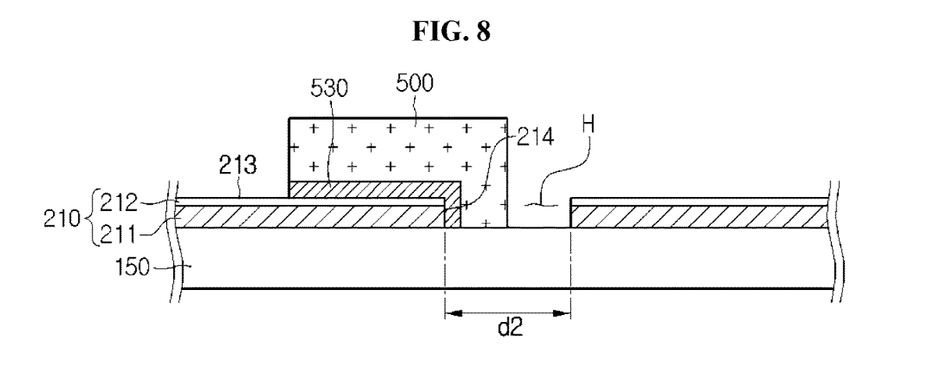
FIG. 8 is another enlarged sectional view showing part C of FIG. 6.

Referring to FIGS. 6 to 8, the hole H may be formed in the back electrode layer 210 exposed by the fourth through holes TH4.

Accordingly, the back electrode layer 210 may include the top surface 213 of the back electrode layer 210 exposed by the fourth through holes TH4 and the lateral side 214 of the back electrode layer 210 exposed by the hole H.

The top surface 213 of the back electrode layer 210 may include MoSe2. In addition, the lateral side 214 of the back electrode layer 210 may include Mo. In detail, the lateral side 214 of the back electrode layer may include $MoSe_2$ and Mo.

The top surface 213 of the back electrode layer may be different from the lateral side 214 of the back electrode layer in electrical conductivity or electrical resistance. In detail, the electrical resistance of the lateral side 214 of the back electrode layer may be lower than that of the top surface 213 of the back electrode layer. In detail, the electrical resistance of the top surface 213 of the back electrode layer may be twice to 20 times higher than that of the lateral side 214 of the back electrode layer.

Referring to FIG. 7, the first bus bar 510 and the second bus bar 520 may be provided in holes H formed in the back electrode layers 210 of the first solar cell C1 and the second solar cell C7. In detail, the first bus bar 510 and the second bus bar 520 may make contact with the top surface 213 of the back electrode layer 210 exposed by the fourth through holes TH4 and the lateral side 214 of the back electrode layer 210 exposed by the hole H.

Accordingly, the first bus bar 510 and the second bus bar 520 may make contact with the top surface 213 of the back electrode layer 210 exposed by the fourth through holes TH4, the lateral side 214 of the back electrode layer 210 exposed by the hole H, and the top surface of the support substrate 150 exposed by the hole G.

Alternatively, as shown in FIG. 8, a conductive material 530 may be formed on the lateral side 214 and the top surface 213 of the back electrode layer exposed by the hole H, and the first and second bus bars 510 and 520 may make contact with the conductive material 530.

The first bus bar 510 and the second bus bar 520 may be partially filled in the hole H. For example, the width d2 of the hole H may be in the range of about 6 mm to 12 mm. In addition, the first bus bar 510 and the second bus bar 520 may be filled to about ⅓ to about ⅔ of the width d2 of the hole H while making contact with the lateral side 214 of the back electrode layer.

If the width d2 of the hole H is less than 6 mm, the first bus bar 510 and the second bus bar 520 may be excellently inserted into the hole H. If the width d2 of the hole H exceeds 12 mm, a dead zone where power generation does not occur is increased, so that efficiency may be degraded.

Figure 9:
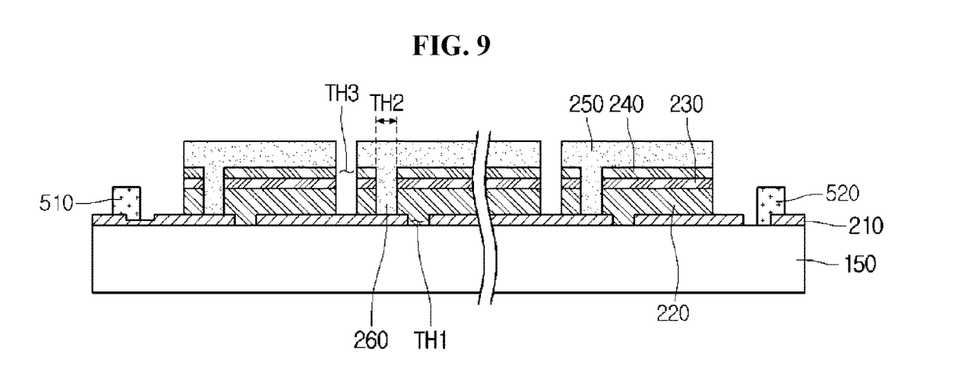
FIG. 9 is still another sectional view taken along line A-A' of the solar cell module of FIG. 2.

Referring to FIG. 9, a groove G and a hole H may be formed in the back electrode layer 210 exposed by the fourth through holes TH4.

In detail, if the groove G is formed in the first solar cell C1, the hole H may be formed in the second solar cell C7. If the hole H is formed in the first solar cell C1, the groove G may be formed in the second solar cell C7.

According to the solar cell of the embodiment, the groove or the hole is formed in the back electrode layer having the bus bar, so that the bus bar may make contact with not only the top surface of the back electrode layer, but also the lateral side of the back electrode layer.

The top surface of the back electrode layer is a contact part between the back electrode layer and the light absorbing layer and includes $MoSe_2$ having substituted Se, as well as Mo. The $MoSe_2$ serves as a resistance layer in the process of transferring the back electrode layer to the bus bar, thereby preventing charges from being moved.

Accordingly, when the bus bar is positioned only on the top surface of the back electrode layer, as the charge movement is interrupted by $MoSe_2$ included in the top surface of the back electrode layer and thus lowered, the efficiency of the solar cell module may be degraded.

Therefore, according to the solar cell of the embodiment, a hole or a groove may be formed in the back electrode layer having the bus bar to expose the lateral side of the back electrode layer. Since the lateral side of the back electrode layer may include Mo more than $MoSe_2$, the interruption of charge movement by $MoSe_2$ may less occur in the lateral side of the back electrode layer.

In other words, according to the solar cell of the embodiment, as the bus bar is arranged in contact with the top surface and the lateral side of the back electrode layer, charge movement occurs toward both of the top surface and the lateral side of the back electrode layer. Accordingly, charges may be more easily moved from the back electrode layer to the bus bar.

Therefore, according to the solar cell module of the embodiment, since an amount of charges moved from the back electrode layer to the bus bar may be improved, the whole efficiency of the solar cell module may be improved.

The protective layer 300 is integrally formed with the solar cell panel 100 through a lamination process in the state that the protective layer 300 is provided on the solar cell panel 100. In addition, the protective layer 300 protects the solar cell panel 100 from being corroded due to moisture infiltration, and protects the solar cell 200 from the shock. The protective layer 300 may include ethylene vinyl acetate (EVA).

The upper substrate 400 provided on the protective layer 300 includes tempered glass representing high transmittance and having an excellent anti-breakage function. In this case, the tempered glass may include low iron tempered glass including the low content of iron. An inner lateral side of the upper substrate may be subject to an embossing treatment in order to increase the scattering effect of light.

A junction box 600 may be further provided below the support substrate 150. The junction box 600 may include a diode and may receive a circuit board connected to the bus bar 500 and a cable 700. In addition, the solar cell module according to the embodiment may further include a wire to connect the bus bar 500 with the circuit board. The cable 700 may be connected with the circuit board, and another solar cell 200.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a support substrate;
   a back electrode layer on the support substrate;
   a light absorbing layer on the back electrode layer;
   a front electrode layer on the light absorbing layer; and
   a bus bar,
   wherein the back electrode layer is configured to be
      formed with a groove upon which a portion of the bus bar is disposed, the groove being formed by a top surface of the back electrode layer on the support substrate, and first at second lateral surfaces of the back electrode layer, wherein the bus bar is in contact with a top surface and the first lateral surface of the back electrode layer, and the second lateral surface of the back electrode layer is exposed by the groove; and wherein top surface includes molybdenum diselenide ($MoSe_2$), and the first and second lateral surfaces each includes molybdenum (Mo) and molybdenum diselenide.

2. The solar cell module of claim 1, further comprising a through hole formed through the light absorbing layer and the front electrode layer, wherein the back electrode layer is exposed by the through hole.

3. The solar cell module of claim 2, wherein the back electrode layer comprises: the top surface exposed by the through hole.

4. The solar cell module of claim 1, wherein the top surface of the back electrode layer has a resistance different from a resistance of the lateral surfaces of the back electrode layer.

5. The solar cell module of claim 4, wherein the top surface of the back electrode layer has the resistance greater than the resistance of the lateral surfaces of the back electrode layer.

6. The solar cell module of claim 4, wherein the top surface of the back electrode layer has the resistance of from twice to 20 times greater than the resistance of the lateral surfaces of the back electrode layer.

7. The solar cell module of claim 2, wherein the groove has a width of 6 mm to 12 mm.

8. The solar cell module of claim 1, further comprising a conductive material making contact with the top surface and the lateral surfaces of the back electrode layer, wherein the bus bar makes contact with the conductive material.

9. The solar cell module of claim 1, further comprising a through hole formed through the light absorbing layer and the front electrode layer, wherein the back electrode layer is exposed by the through hole.

10. The solar cell module of claim 9, wherein the back electrode layer comprises a top surface exposed by the through hole.

11. The solar cell module of claim 10, wherein the top surface and the lateral surfaces include mutually different materials.

12. The solar cell module of claim 11, wherein the top surface of the back electrode layer has a resistance different from a resistance of the lateral surfaces of the back electrode layer.

13. The solar cell module of claim 12, wherein the top surface of the back electrode layer has the resistance greater than the resistance of the lateral surfaces of the back electrode layer.

14. The solar cell module of claim 12, wherein the top surface of the back electrode layer has the resistance of from twice to 20 times greater than the resistance of the lateral surfaces of the back electrode layer.

15. The solar cell module of claim 9, wherein the groove has a width of 6 mm to 12 mm.

16. The solar cell module of claim 9, further comprising a conductive material making contact with the top surface and the lateral surfaces of the back electrode layer, wherein the bus bar makes contact with the conductive material.

17. The solar cell module of claim 1, wherein the bus bar comprises a first bus bar and a second bus bar spaced apart from each other.

* * * * *